United States Patent
Narimatsu

[11] Patent Number: 5,991,007
[45] Date of Patent: *Nov. 23, 1999

[54] STEP AND SCAN EXPOSURE SYSTEM AND SEMICONDUCTOR DEVICE MANUFACTURED USING SAID SYSTEM

[75] Inventor: Koichiro Narimatsu, Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/965,039

[22] Filed: Nov. 5, 1997

[30] Foreign Application Priority Data

May 23, 1997 [JP] Japan .................................. 9-133946

[51] Int. Cl.$^6$ .................... G03B 27/42; G03B 27/54
[52] U.S. Cl. .................................... 355/53; 355/67
[58] Field of Search .................... 355/53, 55, 67, 355/77; 250/548; 356/400, 401, 375, 399; 430/5, 30

[56] References Cited

U.S. PATENT DOCUMENTS

| | | | |
|---|---|---|---|
| 5,015,866 | 5/1991 | Hayashi | 250/548 |
| 5,448,332 | 9/1995 | Sakakibara et al. | 355/53 |
| 5,569,930 | 10/1996 | Imai | 250/559.4 |
| 5,602,399 | 2/1997 | Mizutani | 250/548 |
| 5,635,722 | 6/1997 | Wakamoto et al. | 250/548 |
| 5,693,439 | 12/1997 | Tanaka et al. | 430/30 |
| 5,742,067 | 4/1998 | Imai | 250/548 |

FOREIGN PATENT DOCUMENTS

| | | |
|---|---|---|
| 6-260391 | 9/1994 | Japan . |
| 6-283403 | 10/1994 | Japan . |
| 7-130635 | 5/1995 | Japan . |
| 7-161614 | 6/1995 | Japan . |
| 8-64506 | 3/1996 | Japan . |
| 8-236427 | 9/1996 | Japan . |

*Primary Examiner*—Safet Metjahic
*Assistant Examiner*—Hung Henry Nguyen
*Attorney, Agent, or Firm*—McDermott, Will & Emery

[57] ABSTRACT

A step and scan exposure system projects a reticle image onto a semiconductor wafer mounted on a semiconductor wafer stage by a projection optical system in a slit scan scheme, focusing illumination light on the semiconductor wafer to form a plurality of focus sense areas arranged in a direction perpendicular to a scanning direction, receiving reflected illumination light by a plurality of photodetectors, and controlling the wafer stage by the signals from the plurality of photodetectors. In one embodiment, the signals from the plurality of photodetectors are selected, for controlling the wafer stage, corresponding to designated regions for focusing on the semiconductor wafer.

10 Claims, 10 Drawing Sheets

Scanning direction
(Y direction)

State of auto-focusing in exposing on line A1-B1

Defocus in exposing region 1=0

State of auto-focusing in exposing on line A2-B2

Defocus in exposing region 1=0

STEP AND SCAN EXPOSURE SYSTEM AND SEMICONDUCTOR DEVICE MANUFACTURED USING SAID SYSTEM

BACKGROUND OF THE INVENTION

1. Field of the Invention

The present invention relates to a projection exposure system and method for a semiconductor wafer, and further relates to a semiconductor device manufactured using the above system or method. More specifically, the present invention relates to an improvement in exposure focusing and leveling, of the step and scan exposure system and method.

2. Background Art

Referring to FIG. 1 and FIG. 2(a) to FIG. 2(c), a description will be made of a step and scan exposure system and method, or a slit scan-type projection exposure system and method, to which the invention is directed (this type of apparatus will be hereinafter referred to as "scan-type stepper" where appropriate) and, particularly, to an example of how focusing and leveling are performed in the system and method.

FIG. 1 shows the configuration of a scan-type stepper. FIG. 2(a) shows a slit-like exposure area projected onto the wafer, and FIG. 2(b) and FIG. 2(c) show pattern forming plates of an illumination-side and a reception-side for an auto-focus function, respectively.

The principle of operation of the scan-type stepper will be described below. A pattern on a reticle 2 is projected onto a semiconductor wafer 8 in a slit-like exposure area 7, that is formed by illumination light, emitted from an illumination system 1 and passed through a projection optical system 6. FIG. 2(a) shows a slit-like exposure area 7 (or a slit-like exposure field) formed on the semiconductor wafer 8.

The entire exposure area of the wafer 8 is exposed by moving or scanning the reticle 2, mounted on a reticle stage 3, and the wafer 8, mounted on a wafer-side XY stage 11, in opposite directions. In this operation, the reticle stage 3 and the wafer-side XY stage 11 are properly synchronized with each other in terms of scanning speeds, alignment, etc., by a main controller 16 via a reticle stage controller 13, and a wafer-side XYZ stage controller 15.

Further, in the above operation, a Z position and an inclination of the wafer 8 are measured by a focusing and leveling sensor system 17 to 27 (described later in detail), and a Z stage wafer position detector 14. The signals are input to the main controller 16. The main controller 16 controls the wafer Z stage 12, via the wafer XYZ stage controller 15, so that the exposure surface of the wafer 8 is positioned at the image surface of the slit-like exposure area 7, that is formed by the projection optical system 6.

Next, the principle of operation of the focusing and leveling sensor system 17 to 27 and the wafer Z stage position detector 14 will be described. Illumination light, that is different from exposure light, and does not cause a chemical change in a photoresist formed on the wafer 8, is introduced from an illumination optical system (not shown) via an optical fiber 17. The illumination emitted from the optical fiber 17 is applied to a pattern forming plate 19 of the illumination-side, via a condenser lens 18. FIG. 2(b) shows the shape of the pattern forming plate 19 of the illumination-side. The illumination light passes through a plurality of openings formed in the pattern forming plate 19 of the illumination-side.

Returning to FIG. 1, the illumination light that has passed through the pattern forming plate 19 of the illumination-side, is projected onto the exposure surface of the wafer 8 via a lens 20, a mirror 21, and a projection objective lens 22. As a result, an image of a pattern, on the pattern forming plate 19 of the illumination-side, is formed as focus sense areas on the exposure surface of the wafer 8 in the inclined pattern. FIG. 2(a) shows a state where a plurality of focus sense areas F1 to Fn are arranged in the slit-like exposure area 7.

Returning to FIG. 1, the illumination light reflected by the wafer 8 is projected onto photodetecting surfaces of photodetectors 27, via a condensing objective lens 23, a mirror 24, an imaging lens 25, and a pattern plate 26 of the reception-side. FIG. 2(c) shows the shape of the pattern plate 26 of the reception-side, which is the same as that of the pattern plate 19 of the illumination side.

Returning to FIG. 1, an image of the pattern on the pattern forming plate 19 of the illumination-side is formed on the photodetecting surfaces of the photodetectors 27. If the Z position of the wafer 8 is varied, the illumination light reflected by the wafer 8 is shifted in the X direction on the pattern plate 26 of the reception-side. As a result, the quantity of light beam that passes through the pattern plate 26 of the reception-side and reaches the photodetectors 27, varies. Thus, the Z position of the wafer 8 is converted into the position in the X direction, on the pattern plate 26 of the reception-side, and light quantity on the photodetectors 27. The light quantity is further converted into a voltage through current to voltage conversion, and supplied to the Z stage wafer position detector 14 as a focus signal. The wafer-side Z stage position detector 14 performs a computation on the focus signal that is received from each photodetector 27, and supplies a resulting signal to the main controller 16.

Reference numeral 4 denotes a reticle stage interferometer mirror. Reference numeral 5 denotes a reticle stage interferometer. Reference numeral 9 denotes a wafer stage interferometer mirror. Reference numeral 10 denotes a wafer stage interferometer.

Next, the conventional method of signal processing will be described. FIG. 11(a) to FIG. 11(c) illustrate a state of focusing and leveling on a semiconductor chip in a conventional exposing method of a scan-type stepper. Consider an exposure area in a semiconductor chip, a memory-incorporated logic, for example, having a pattern layout shown in FIG. 11(a). In an auto-focusing system of the scan-type stepper, focus sense areas F1 to Fn are formed perpendicularly to a scanning direction as shown in FIG. 11(a). The plurality of photodetectors 27 (see FIG. 2(c)); (hereinafter referred to as focus sensors AF1 to AFn where appropriate) corresponding to the respective focus sense areas F1 to Fn, perform sensing along the scanning direction at the time of the exposure or prior to the exposure.

Conventionally, auto-focusing is performed by using a signal, such as an average value; $(\Sigma SFn)/n$ of the focus signals SF1 to SFn from all the focus sensors AF1–AFn, for instance. Namely, the wafer-side XY stage 11, on which the wafer 8 is absorbed, and the wafer-side Z stage 12, are vertically moved including a leveling correction or inclination correction.

FIG. 11(b) and FIG. 11(c) illustrate states of focusing and leveling obtained on a semiconductor wafer, or more specifically a semiconductor chip, by the above-described conventional auto-scan method. FIG. 11(a) shows regions-1 and regions-2 having a level difference in between on the semiconductor chip surface and an arrangement of focus sense areas F1 to Fn formed on those regions.

FIG. 11(b) and FIG. 11(c) show leveling states in cases where a line A1-B1 or A2-B2 in FIG. 11(a) are illuminated, respectively. Where a level difference exists in the direction perpendicular to the semiconductor chip scanning direction, i.e.: X direction, as in the case concerned, the focusing and leveling state on either the line A1-B1 or A2-B2 are such that defocusing of ½ of the level difference between the region-1 and the region-2 occurs. For example, if the level difference between the region-1 and the region-2 is 1 μm, the defocusing amounts to 0.5 μm, which is fatal to submicron lithography.

In exposing a semiconductor chip, it is not always the case that a region-1 (a memory region, for example) and a region-2 (a logic region, for example) are exposed in the same step. That is, a region-1 and a region-2 may be exposed by using different masks. When the semiconductor chip is exposed by a scan-type stepper in such a situation, autofocusing of exposure may be performed separately on either region-1 or region-2 depending on each step.

Therefore, if regions on a chip to be subjected to autofocusing can be designated by an exposure program for each step, the accuracy of the auto-focusing is improved, because the auto-focusing is not affected by level differences that are formed within regions irrelevant to each step. This method is effective particularly in a case where a semiconductor chip has large level differences and the depth of focus is small.

FIG. 12(a) to FIG. 12(c) illustrate states of focusing and leveling on another semiconductor chip having level differences by the conventional auto-scan method.

FIG. 12(a) shows a region-1 and a region-2 on a semiconductor chip surface having a level difference in a scanning direction, i.e.: Y direction, as indicated by an arrow in the drawing, and an arrangement of focus sense areas F1 to Fn formed on those regions. FIG. 12(b) and FIG. 12(c) show leveling states in cases where the chip surface is illuminated along the line A1-A2 or B1-B2 in FIG. 12(a), respectively.

In this case, when focusing is made on the line B1-B2 in the region-2, defocusing will not arise ideally, because the focus sense areas F1 to Fn are within the region-2 in the scanning direction, i.e.: Y direction, as shown in FIG. 12(c). However, if the chip surface has a level difference in the scanning direction, i.e.: Y direction, defocusing will arise along the line A1-A2 which is in the vicinity of the step edge as shown in FIG. 12(b).

The reason for the above will be explained below. In the auto-focus system of the conventional scan-type stepper, the focus sense areas F1 to Fn form angles of 45° with the scanning direction. Each focus sense area F1 to Fn has a size of about 0.2 mm×2.0 mm. Since the length of the focus sense areas F1 to Fn in the Y direction amounts to 1.4 mm (=2 mm/√2), for instance, the focusing varies depending on the proportion of areas of the region-1 or region-2 on which the focus sense areas F1 to Fn extend.

Thus, defocusing occurs in an exposure in the vicinity of the boundary of the region-1 and region-2. For example, if the focus sense areas F1 to Fn extend in the region-1 and region-2 at a ratio of 1:2 and the level difference between those regions is 1 μm, the defocusing amounts to 0.33 μm, which is fatal to submicron lithography.

In exposing a semiconductor chip, the region-1, such as a memory area, and the region-2, such as a logic area, are not exposed in the same step. That is, region-1 and region-2 are exposed by using different masks. When this kind of semiconductor chip is exposed by a scan-type stepper, autofocusing of the exposure may be performed separately on region-1 or region-2 depending on each step.

Therefore, if regions on a chip for auto-focusing can be reduced by improving the shape of the focus sense area, the accuracy of the auto-focusing is improved, because the auto-focusing is not affected by a level difference that is formed with regions irrelevant to each step. This method is effective particularly in a case where a semiconductor chip has large level differences and the depth of focus is small.

SUMMARY OF THE INVENTION

The present invention has been made to solve the above problems in the conventional art, and therefore an object of the invention is to provide a step and scan exposure system, or slit scan-type projection exposing apparatus and method, which are free of defocusing in an exposure, even if level differences exist on the surface of a semiconductor wafer or chip. The further object of the present invention is to provide a semiconductor manufacturing method using such apparatus and method.

According to one aspect of the present invention, a step and scan exposure system comprises a means for projecting a reticle image onto a semiconductor wafer mounted on a semiconductor wafer, stage by a projection optical system, in a slit scan scheme. A means is provided for focusing illumination light on the semiconductor wafer, to form a plurality of focus sense areas arranged, in a direction perpendicular to a scanning direction. A means is provided for receiving reflected illumination light by a plurality of photodetectors. A means is provided for controlling the wafer stage by the signals from the plurality of photodetectors, wherein the signals from the plurality of photodetectors are selected, for controlling the wafer stage, corresponding to designated regions for focusing on the semiconductor wafer.

According to another aspect of the present invention, a step and scan exposure system comprises a means for projecting a reticle image onto a semiconductor wafer, mounted on a wafer stage by a projection optical system in a slit scan scheme. A means is provided for focusing illumination light on the semiconductor wafer, to form a plurality of focus sense areas, arranged in a direction perpendicular to a scanning direction. A means is provided for receiving reflected illumination light by a plurality of photodetectors. A means is provided for controlling the wafer stage by the signals from the plurality of photodetectors. Further, the focus sense areas extends 1 mm or less in the scanning direction on the surface of the semiconductor wafer.

In the step and scan exposure system, the designated regions have preferably the same surface level on the semiconductor wafer.

According to another aspect of the present invention, a semiconductor device is manufactured by developing the reticle image formed on a semiconductor wafer, by the step and scan exposure system as defined above.

Other and further objects, features and advantages of the invention will appear more fully from the following description.

BRIEF DESCRIPTION OF THE DRAWINGS

The invention disclosed herein will be understood better with reference to the following drawings in which.

BEST MODE OF CARRYING OUT THE INVENTION

Figure 1:
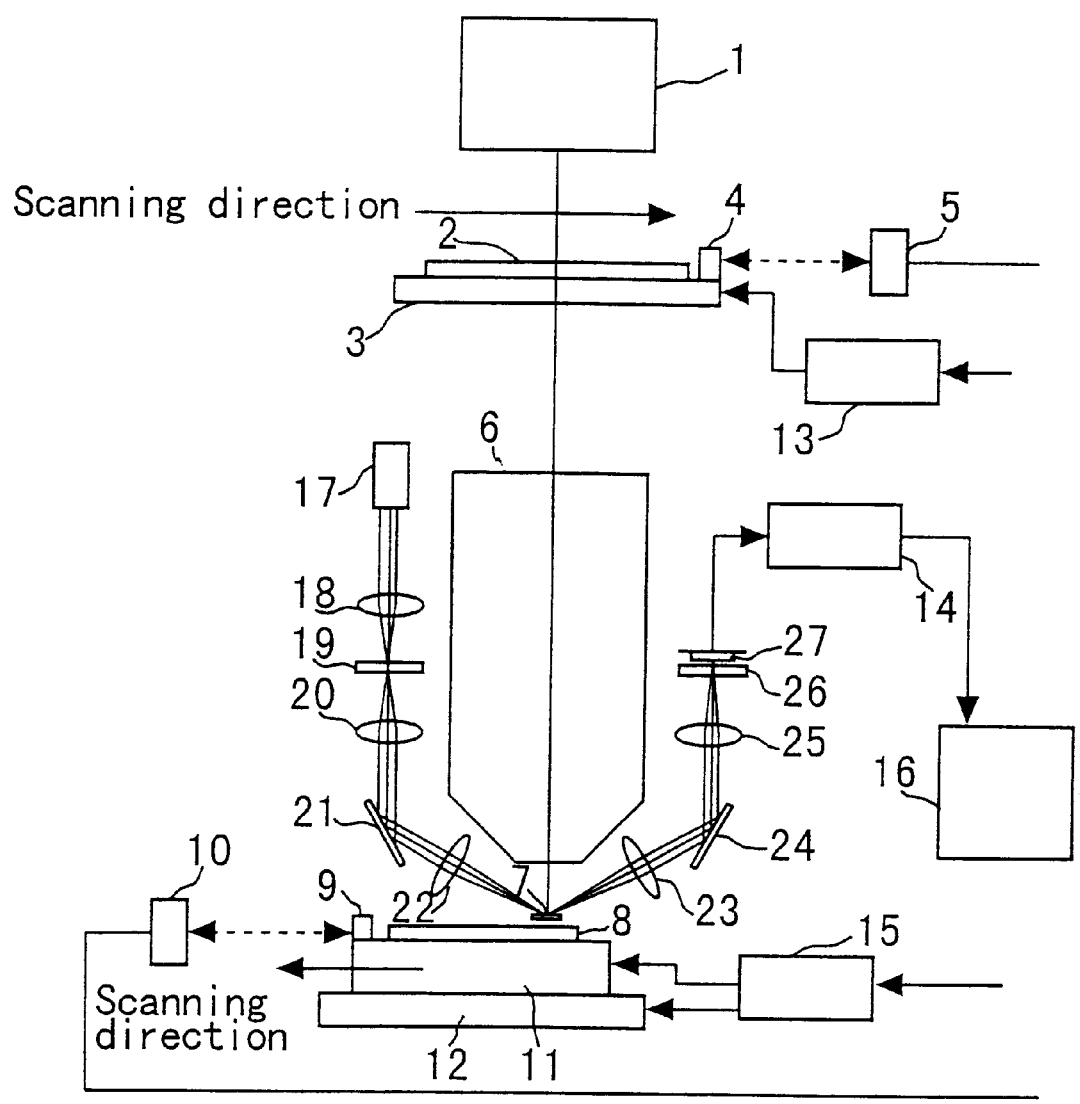
FIG. 1 shows a configuration of a scan-type stepper to which the present invention is directed.
Figure 2A:
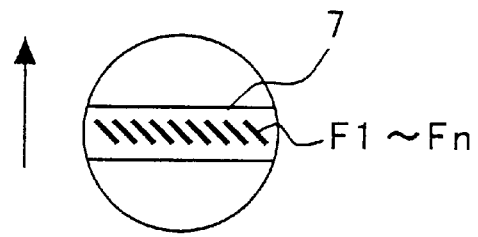
FIG. 2(a) is a plan view of a slit-like exposure area and focus sense areas, projected on a wafer in the scan-type stepper of FIG. 1.
Figure 2B:
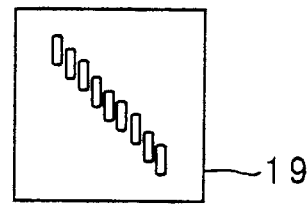
FIG. 2(b) and FIG. 2(c) show each pattern plate of an illumination side and a reception-side for an auto-focus function, respectively.
Figure 2C:
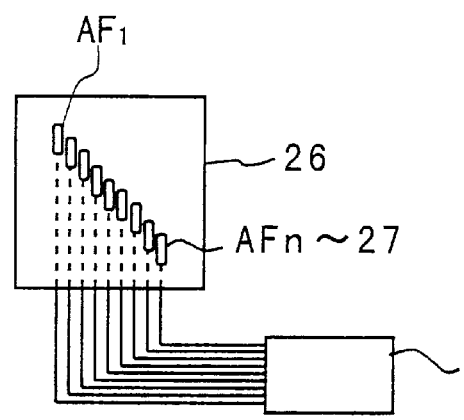
Figure 3:
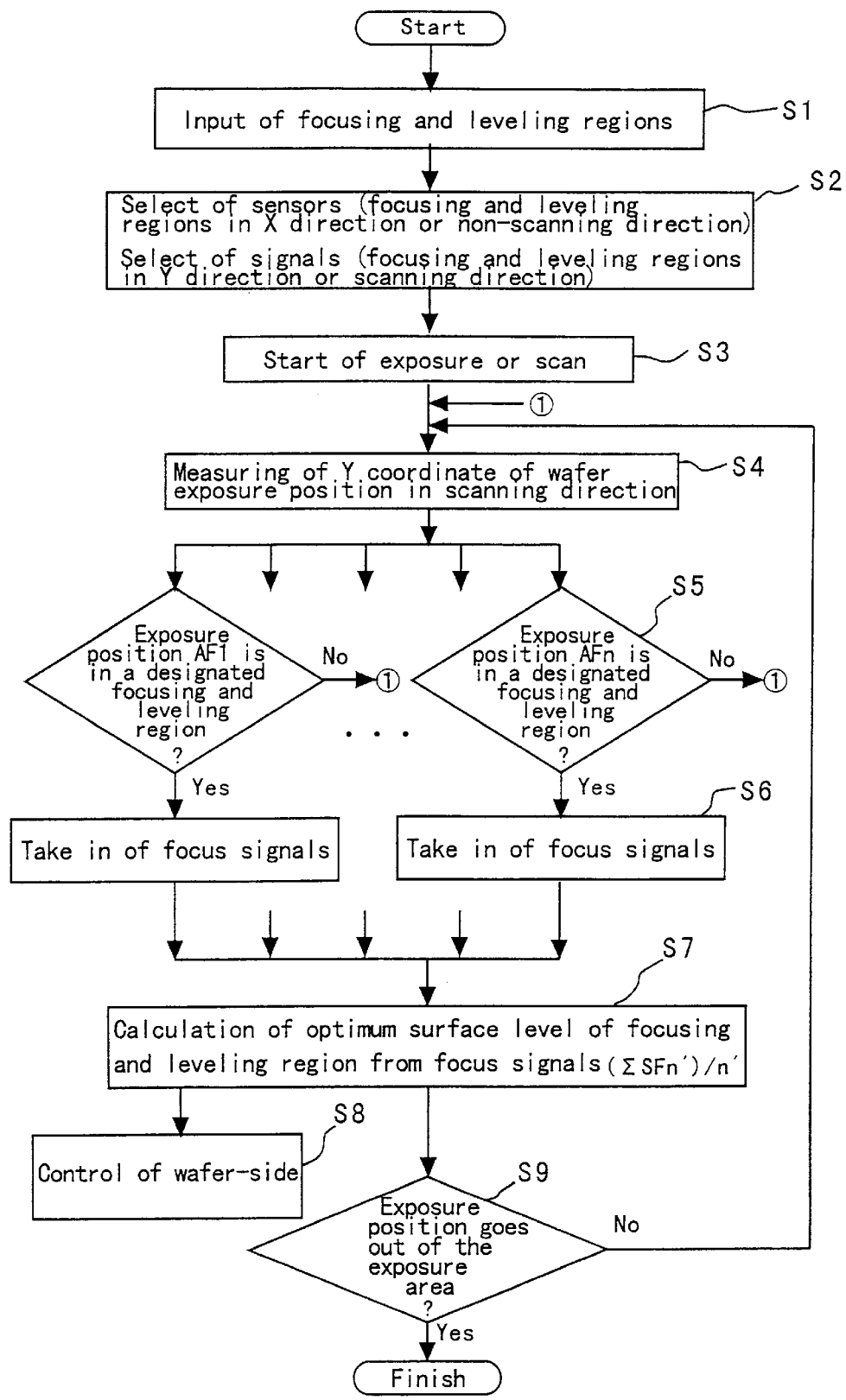
FIG. 3 is a flowchart showing a process of focusing and leveling in a scan-type stepper according to the first embodiment of the present invention.
Figure 4A:
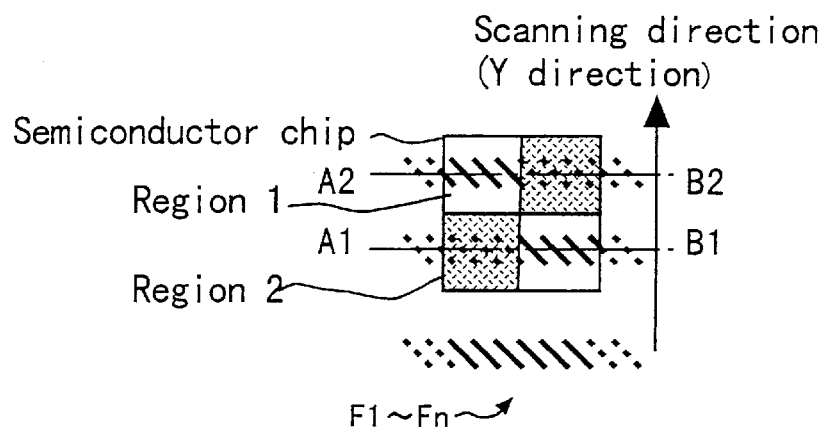
FIG. 4(a) to FIG. 4(c) illustrate focusing and leveling states on a semiconductor chip in the scan-type stepper according to the first embodiment of the invention.
Figure 4B:
Figure 4C:

This invention will be described in further detail by way of example with reference to the accompanying drawings.
First Embodiment FIG. 1 shows a configuration of a step and scan exposure system or a slit scan type projection exposure system used in a first embodiment of the present invention. FIG. 2(a) is a plan view of a slit-like exposure area and focus sense areas, projected on a wafer in the scan-type stepper of FIG. 1. FIG. 2(b) and FIG. 2(c) are pattern plates of an illumination side and a reception side for auto-focus function in the scan-type stepper of FIG. 1 respectively;

FIG. 3 is a flowchart showing the steps of the auto-focus exposing method according to the first embodiment of the present invention. FIG. 4(a) to FIG. 4(c) show focusing and leveling states on a semiconductor chip, having surface level differences in the direction perpendicular to the scanning direction, by the step and scan exposure system and method of the first embodiment.

The exposing method of the first embodiment will now be described with reference to FIG. 3. First, at the step S1, focusing and leveling regions of a semiconductor wafer are input to an exposure program or the like. At the step S2, the main controller 16 selects, from a plurality of focus sensors AF1 to AFn arranged in the direction perpendicular to the scanning direction, a certain number of focus sensors to be used for each designated focusing region on the semiconductor chip. This is to determine the focusing and leveling regions in the non-scanning direction.

After an exposure or a scan is started at the step S3, the Y coordinate of the wafer exposure position in the scanning direction is measured continuously at the step S4. When the exposure position enters a designated focusing and leveling region at the step S5, the main controller 16 takes in focus signals, SF1 to SFn, from the focus sensors AF1 to Afn, corresponding to the region at the step S6. This is to designate the focusing and leveling region in the scanning direction.

From the focus signals, SF1 to SFn', that are selectively taken in from the focus sensors, AF1 to AFn', in the above manner, an average value ($\Sigma$SFn')/n', for instance, is calculated at the step S7. At the step S8, by using the calculated value, the main controller 16 controls the wafer-side Z stage 12 through the controller 15 to position the wafer 8 at the image plane of the slit-like exposure area 7, formed by the projection optical system 6. At the step S9, the process is finished, when the wafer exposure position goes out of the exposure area. This process is controlled by a program incorporated in the main controller 16, for instance.

FIG. 4(a) to FIG. 4(c) illustrate focusing and leveling states on the semiconductor chip by the above method. FIG. 4(a) shows a region-1 and a region-2 having a level difference in between on the semiconductor chip surface and an arrangement of focus sense areas F1 to Fn formed on those regions. FIG. 4(b) shows a leveling state in a case where line A1-B1 in FIG. 4(a) is illuminated, and focusing is made on region-1. FIG. 4(c) shows a leveling state in a case where line A2-B2 in FIG. 4(a) is illuminated, and focusing is also made on region-1. In FIG. 4(a) to FIG. 4(c), focus signals are taken in from the focus sense areas indicated by solid lines, and the focus signals from the focus sense areas (indicated by broken lines) are not taken in.

In this manner, even if the chip surface has a level difference in the semiconductor chip scanning direction, i.e.: Y direction, the focus signals are selectively taken in from the focus sensors AF1-AFn corresponding to the designated region-1 on which focusing is to be made. Thus, the region-1 on the right side in FIG. 4(a) is adjusted in the Z-direction, when the line A1-B1 is exposed and leveled with focusing.

When the line A2-B2 is leveled with focusing for exposure, the focus signals are selectively taken in from the other focus sensors, AF1 to AFn corresponding to the designated region-1 on which focusing is to be made. Thus, the region-1 on the left side in FIG. 4(a) is adjusted in the Z-direction as in the above case.

With the above method, focusing is correctly made on the wafer surface, and an exposure can be performed without defocusing on the wafer.
Second Embodiment In the second embodiment of the present invention, a step and scan exposure system has the same configuration as shown in FIG. 1 and FIG. 2(a) to FIG. 2(c). However, the shape of focus sense areas are different as explained below.

Figure 5A:
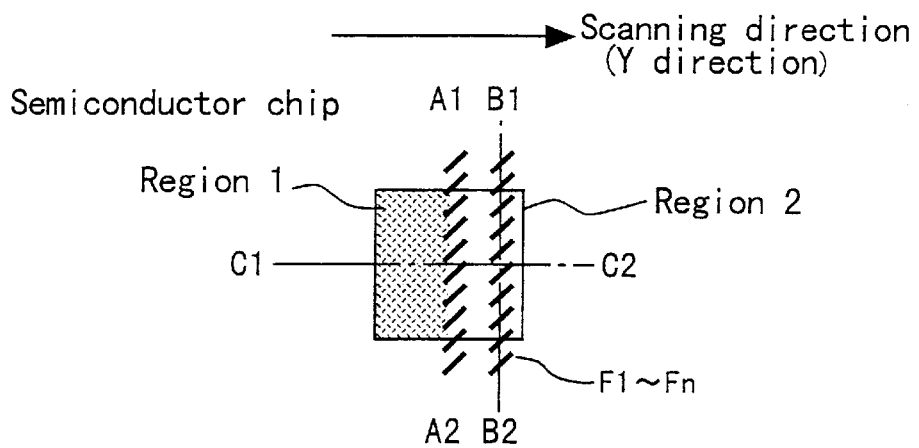
FIG. 5(a) to FIG. 5(c) illustrate focusing and leveling states on a semiconductor chip in a scan-type stepper according to the second embodiment of the invention.
Figure 5B:
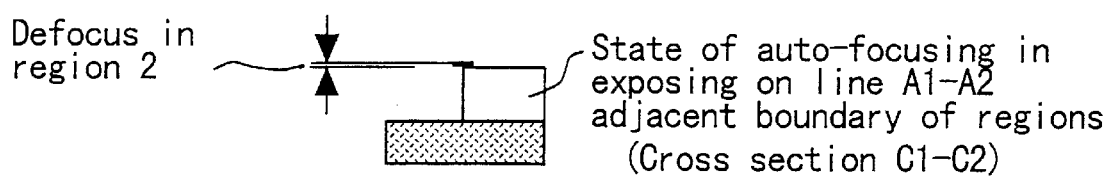
Figure 5C:
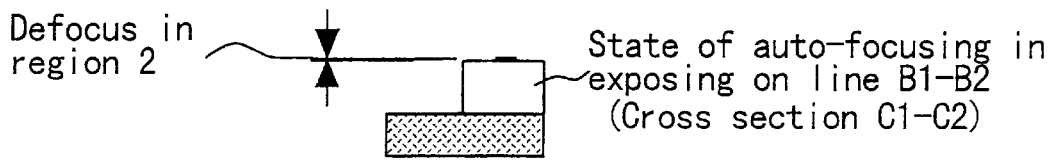

FIG. 5(a) to FIG. 5(c) illustrate focusing and leveling states on a semiconductor chip having surface level differences in the scanning direction.

FIG. 5(a) shows regions-1 and regions-2 having a level difference in between on the semiconductor chip surface and an arrangement of focus sense areas F1 to Fn formed on those regions.

As shown in FIG. 5(a), the focus sense areas, F1 to Fn, are shortened in their longitudinal directions as compared with the focus sense areas, F1 to Fn, shown in FIG. 4(a). This is realized by reducing the sizes of the openings in the pattern plate 19 of the illumination-side and the pattern plate 26 of the reception-side (see FIG. 2(b) and FIG. 2(c)).

FIG. 5(b) shows a leveling state in a case where the line A1-A2 in FIG. 5(a) is illuminated and focusing is made on the region-2. FIG. 5(c) shows a leveling state in a case where the line B1-B2 in FIG. 5(a) is illuminated and focusing is also made on the region-2.

Now assume a case where the longitudinal length of the focus sense areas, F1 to Fn, is reduced from conventional 2 mm to 1 mm. As for the focusing state of the line A1-A2, the level difference between the region-1 and region-2 causes defocusing as in the conventional case.

However, in the present invention, the length of the focus sense areas, F1 to Fn, is 0.7 mm (=1 mm/√2) in the scanning direction, i.e.: Y direction, which is half of the conventional value 1.4 mm (=2 mm/√2). Thus, although the focusing state still varies on the areas where the focus sense areas, F1 to Fn, extend on both region-1 and region-2, the defocusing area is halved as compared to the conventional case.

More specifically, in the conventional case, the level difference between the region-1 and region-2 causes defocusing in the portion of region-2 extending from the step edge over a length of 1.4 mm. In contrast, in this embodiment, the length of the defocused portion can be halved to 0.7 mm.

Figure 6:
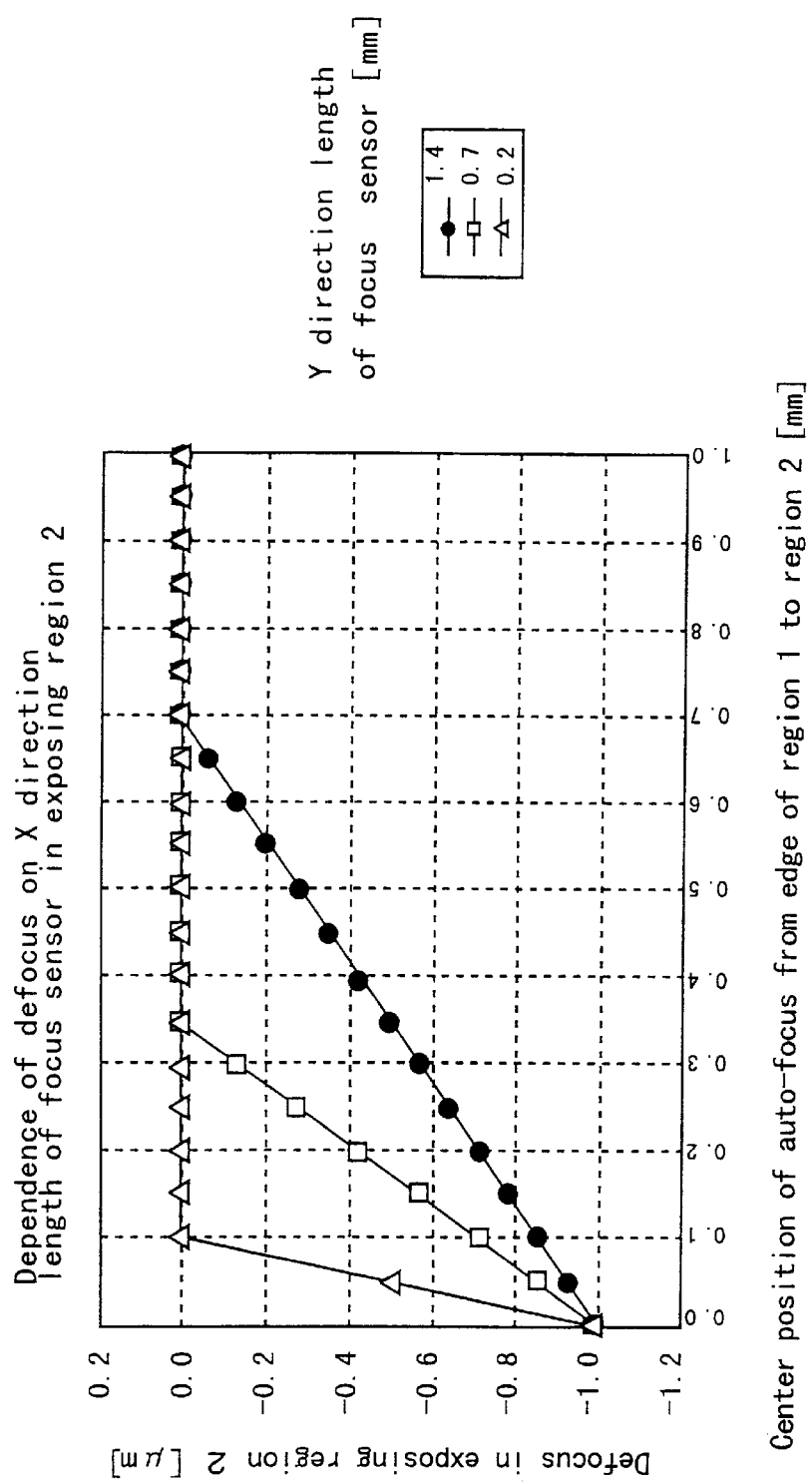
FIG. 6 shows how the focusing state varies in the scan-type stepper according to the second embodiment.

FIG. 6 is a simulation graph showing how the focusing state varies on the boundary of the region-1 and region-2. The focusing state varies depending on the area on which the focus sense areas F1 to Fn extend on the region-1 and region-2. FIG. 6 shows a relationship between the defocusing amount (vertical axis) and the distance of the focusing center position from the step edge (horizontal axis) for three kinds of focus sense areas F1 to Fn having lengths, 1.4 mm, 0.7 mm, or 0.2 mm, in the scanning direction, i.e. Y direction. It is apparent from FIG. 6 that shortening the focus sense areas F1 to Fn in the scanning direction is effective.

Third Embodiment

Figure 7:
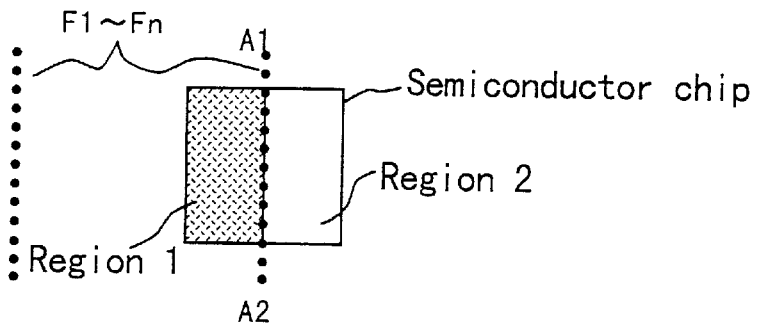
FIG. 7 shows the shape of focus sense areas in a scan-type stepper according to the third embodiment of the invention.

FIG. 7 shows a shape of focus sense areas F1 to Fn according to the third embodiment of the present invention, which are used in exposing a semiconductor chip having level differences in the scanning direction. In this embodiment, each of the focus sense areas F1 to Fn has a dot shape having the same length, of 1 mm or less, in the X and Y directions. As the dots are smaller, the defocused portion can be reduced in size.

Fourth Embodiment

Figure 8:
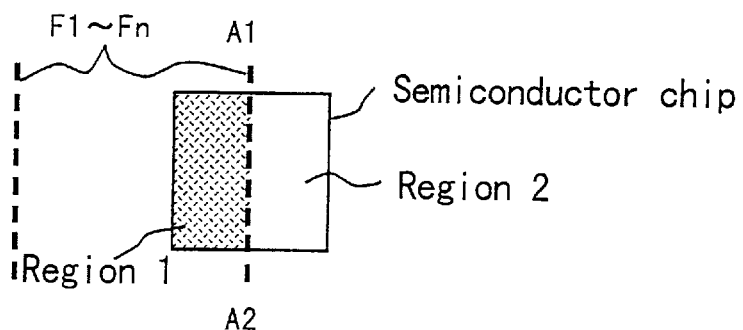
FIG. 8 shows the shape of focus sense areas in a scan-type stepper according to the fourth embodiment of the invention.

FIG. 8 shows a shape of the focus sense areas F1 to Fn according to the fourth embodiment of the present invention, which are used in exposing a semiconductor chip having level differences in the scanning direction.

As shown in FIG. 8, a plurality of exposure regions are arranged perpendicular to the scanning direction in a rectangular shape. That is, the focus sense areas F1 to Fn are line-shaped and arranged such that their longitudinal axis is perpendicular to the scanning direction. As the width of the focus sense areas F1 to Fn in the scanning direction, i.e.: in the Y direction, is smaller, the defocussing area on the semiconductor wafer can be reduced in size.

Fifth Embodiment

Figure 9:
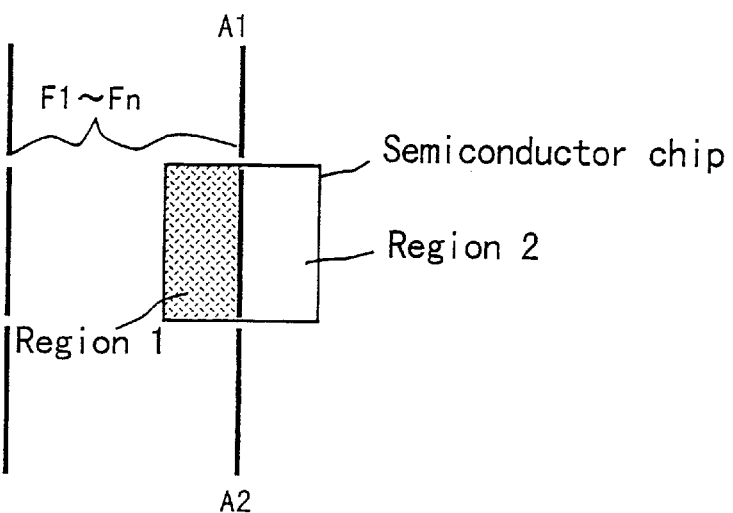
FIG. 9 shows the shape of focus sense areas in a scan-type stepper according to the fifth embodiment of the invention.

FIG. 9 shows another shape of the focus sense areas F1 to Fn according to the fifth embodiment of the invention, which are used in exposing a semiconductor chip having level differences in the scanning direction.

As shown in FIG. 9, the focus sense areas F1 to Fn are arranged perpendicular to the scanning direction, so as to assume a single line having the same length as the region on which focusing is to be made. As the width of the focus sense areas F1 to Fn in the scanning direction, i.e.: in the Y direction, is smaller, the defocussing area on the semiconductor wafer can be reduced in size.

Sixth Embodiment

The sixth embodiment is directed to a focusing and leveling method for a semiconductor chip having surface level differences both in the scanning direction, as in the case of FIG. 5(a) to FIG. 5(c), and in the direction perpendicular to the scanning direction, as in the case of FIG. 4(a) to FIG. 4(c).

Figure 10:
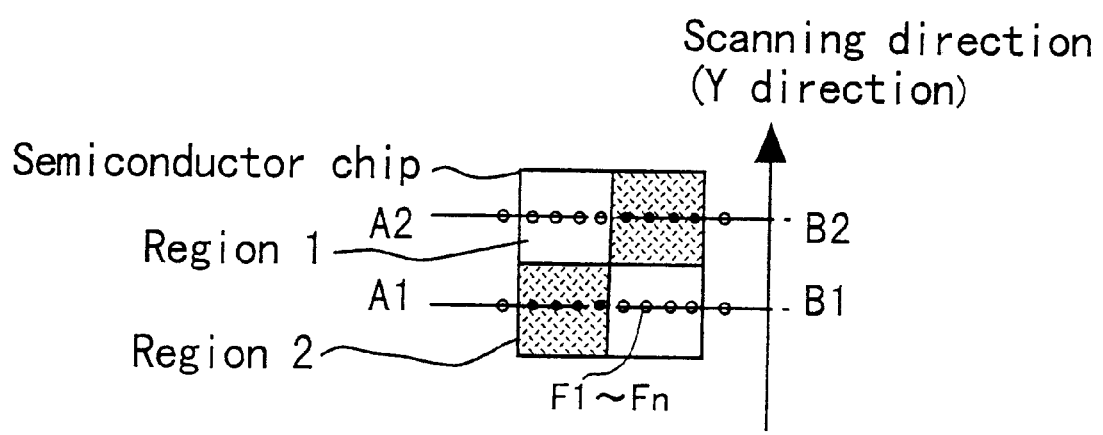
FIG. 10 illustrates focusing and leveling states on a semiconductor chip in the scan-type stepper according to the sixth embodiment of the invention.
Figure 11:
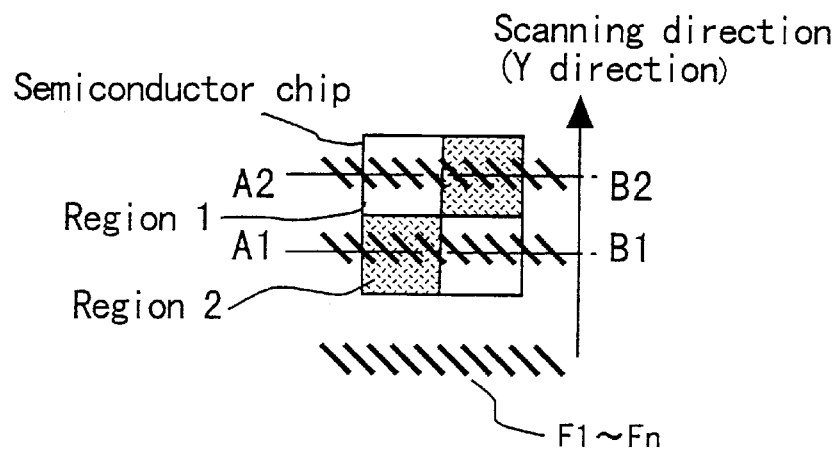
FIG. 11(a) to FIG. 11(c) illustrate focusing and leveling states on a semiconductor chip in a conventional scan-type stepper.
Figure 11:
Figure 11:
Figure 12A:
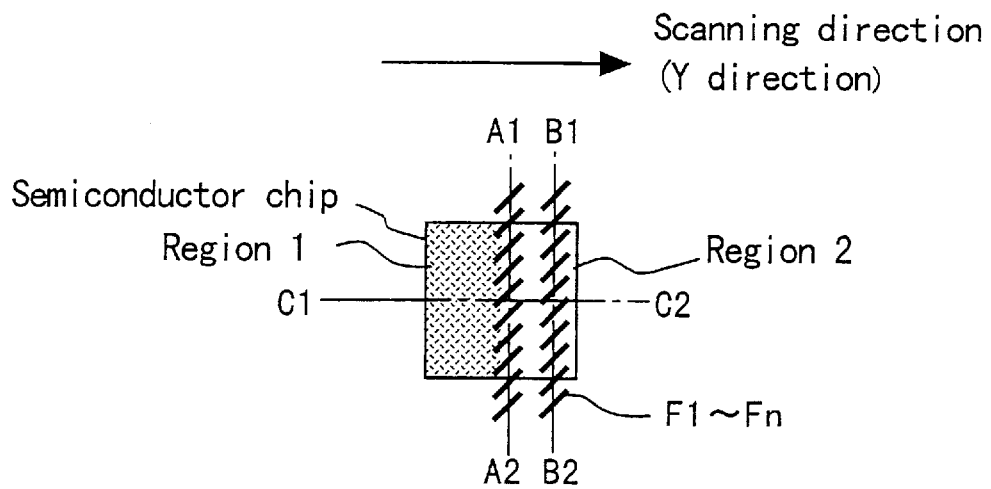
FIG. 12(a) to FIG. 12(c) illustrate focusing and leveling states on another semiconductor chip in the conventional scan-type stepper.
Figure 12B:
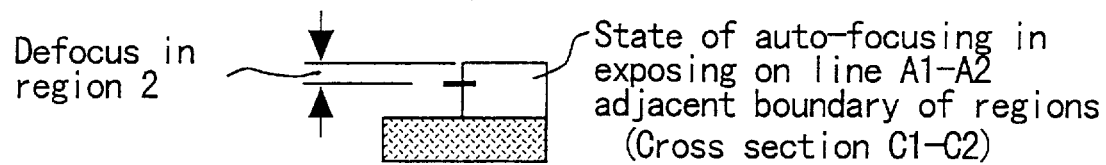
Figure 12C:
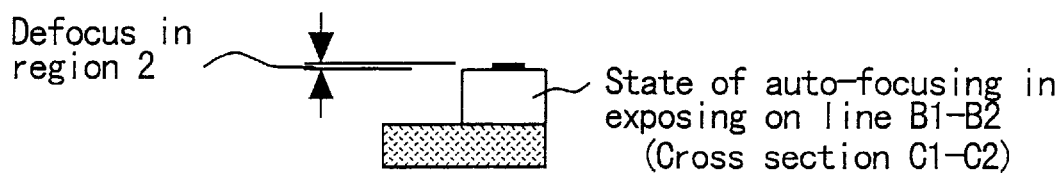

FIG. 10 shows a plan view of a semiconductor chip surface having regions-1 and regions-2, with surface level differences both in the scanning direction and in the direction perpendicular, and, an arrangement of the focus sense areas F1 to Fn formed on those regions.

In this embodiment, the length of the focus sense areas F1 to Fn in the scanning direction is reduced, to 1 mm or less, for example, in the manner as described in the second embodiment.

Further, as described in the first embodiment, for the surface level differences in the direction perpendicular to the scanning direction, i.e.: in the X direction, the focus signals are taken in from the designated focus sensors AF1-AFn.

In this embodiment, the features of the first and second embodiments are combined. As a result, defocusing can be avoided even in the case where surface level differences exist on a semiconductor wafer or chip, both in the scanning direction and in the direction perpendicular thereto.

The step and scan exposure system and method according to the present invention have been described above. By using the step and scan exposure system and method as stated above, semiconductor devices can be manufactured by forming patterns on a semiconductor wafer and processing it. By manufacturing semiconductor devices in this manner, variations in line widths of semiconductor patterns can be reduced and the quality of the semiconductor devices can thereby be improved.

The present invention includes the various aspects summarized below.

In one aspect of the present invention, in a method of a step and scan exposure, a reticle image is projected onto the semiconductor wafer, mounted on a wafer stage by a projection optical system, in a slit scan scheme. Illumination light is focused on the semiconductor wafer to form a plurality of focus sense areas, arranged in a direction perpendicular to a scanning direction. Reflected illumination light is received with a plurality of photodetectors. The wafer stage is controlled by using selected signals from the plurality of photodetectors, which correspond to designated regions on the semiconductor wafer.

In another aspect of the present invention, in a method for a step and scan exposure, a reticle image is projected onto a semiconductor wafer, mounted on a wafer stage by a projection optical system, according to a slit scan scheme. Illumination light is focused on the semiconductor wafer to form a plurality of focus sense areas, extending 1 mm or less in the scanning direction, and arranged in a direction perpendicular to a scanning direction. Reflected illumination light is received with a plurality of photodetectors, and the wafer stage is controlled by using signals from the plurality of photodetectors.

In another aspect of the present invention, in a manufacturing method of a semiconductor device, a reticle image is formed on the semiconductor wafer as described above, and a pattern is formed by developing the reticle image on the semiconductor wafer.

As described above, in the present invention, even if level differences exist on the surface of a semiconductor wafer in the direction perpendicular to the scanning direction, designated regions can be adjusted in the Z direction with a high degree of accuracy, without being affected by the level differences on the semiconductor chip. This is because focusing and leveling are performed on the semiconductor wafer by selecting focus sensors corresponding to the designated regions on which focusing is to be made, and by processing signals from the selected focus sensors. This aspect of the invention is particularly effective when a semiconductor chip has large level differences and the depth of focus is small.

According to another aspect of the invention, even if level differences exist on the surface of a semiconductor wafer in the scanning direction, designated regions can be adjusted in the Z direction with a high degree of accuracy, with a decreased degree of influence of the level differences on the semiconductor chip. This is because focusing and leveling are performed on the semiconductor wafer with focus sense areas applied to the semiconductor wafer which have reduced lengths in the scanning direction. This aspect of the invention is particularly effective in a case where a semiconductor chip has large level differences and the depth of focus is small.

Obviously many modifications and variations of the present invention are possible in light of the above teachings. It is therefore to be understood that within the scope of the appended claims, the invention may be practiced otherwise than as specifically described.

What is claimed is:

1. A step and scan exposure system comprising:
    means for projecting a reticle image onto a semiconductor wafer mounted on a semiconductor wafer stage by a projection optical system in a slit scan scheme;
    means for focusing illumination light on said semiconductor wafer to form a plurality of focus sense areas arranged in a direction perpendicular to a scanning direction of the projection optical system;
    a plurality of photodetectors for receiving reflected illumination light and producing signals corresponding to the reflected illumination light;
    means for designating focusing regions on the semiconductor water based on surface level differences of the semiconductor wafer in a direction perpendicular to the scanning direction of the projection optical system;
    means for selecting the signals corresponding to the designated focusing regions; and
    means for controlling said wafer stage responsive to the selected signals from said plurality of photodetectors.

2. The step and scan exposure system according to claim 1, wherein said designated focusing regions are disposed at one surface level on said semiconductor wafer.

3. A step and scan exposure system comprising:
    means for projecting a reticle image onto a semiconductor wafer mounted on a wafer stage by a projection optical system in a slit scan scheme;
    means for focusing illumination light on said semiconductor wafer to form a plurality of focus sense areas arranged in a direction perpendicular to a scanning direction of the projection optical system;
    means for receiving reflected illumination light by a plurality of photodetectors; and
    means for controlling said wafer state by signals from said plurality of photodetectors;
    wherein said focus sense areas extend 1 mm or less in the scanning direction on the surface of said semiconductor wafer.

4. The step and scan exposure system according to claim 3, wherein said plurality of focus sense areas are formed in a rectangle and arranged on said semiconductor wafer with the longitudinal axis thereof perpendicular to the scanning direction.

5. The step and scan exposure system according to claim 3, wherein each of said focus sense areas is formed in a dot shape.

6. The step and scan exposure system according to claim 3, wherein said focus sense area is formed in a rectangle extending perpendicularly to the scanning direction over a length of said designated region.

7. The step and scan exposure system according to claim 3, wherein said signals from said plurality of photodetectors are selected, for controlling said wafer stage, corresponding to designated regions on said semiconductor wafer.

8. The step and scan exposure system according to claim 7, wherein said designated regions are disposed at one surface level on said semiconductor wafer.

9. A step and scan exposure method, comprising the steps of:
    projecting a reticle image onto a semiconductor wafer mounted on a semiconductor wafer stage by a projection optical system in a slit scan scheme;
    focusing illumination light on said semiconductor wafer to form a plurality of focus sense areas arranged in a direction perpendicular to a scanning direction of the projection optical system;
    receiving reflected illumination light and producing signals corresponding to the reflected illumination light;
    designating focusing regions on the semiconductor wafer based on surface level differences of the semiconductor wafer in the direction perpendicular to the scanning direction of the projection optical system;
    selecting the signals corresponding to the designated focusing regions; and
    controlling said semiconductor wafer stage responsive to the selected signals.

10. A step and scan exposure method comprising the steps of:
    projecting a reticle image onto a semiconductor wafer mounted on a semiconductor wafer stage by a projection optical system in a slit scan scheme;
    focusing illumination light on said semiconductor wafer to form a plurality of focus sense areas arranged in a direction perpendicular to a scanning direction and to form the length of the focus sense area to be 1 mm or less in the scanning direction;
    receiving reflected illumination light by a plurality of photodetectors; and
    controlling said semiconductor wafer stage by the focus signals from said plurality of photodetectors.

* * * * *